US010008395B2

(12) United States Patent
Hembree et al.

(10) Patent No.: US 10,008,395 B2
(45) Date of Patent: Jun. 26, 2018

(54) STACKED SEMICONDUCTOR DIE ASSEMBLIES WITH HIGH EFFICIENCY THERMAL PATHS AND MOLDED UNDERFILL

(71) Applicant: Micron Technology, Inc., Boise, ID (US)

(72) Inventors: David R. Hembree, Boise, ID (US); William R. Stephenson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/298,156

(22) Filed: Oct. 19, 2016

(65) Prior Publication Data

US 2018/0108592 A1 Apr. 19, 2018

(51) Int. Cl.
| | |
|---|---|
| *H01L 23/28* | (2006.01) |
| *H01L 21/00* | (2006.01) |
| *H01L 21/56* | (2006.01) |
| *H01L 21/48* | (2006.01) |
| *H01L 23/367* | (2006.01) |
| *H01L 23/495* | (2006.01) |

(52) U.S. Cl.
CPC ........ *H01L 21/563* (2013.01); *H01L 21/4882* (2013.01); *H01L 23/3672* (2013.01); *H01L 23/49568* (2013.01)

(58) Field of Classification Search
CPC ................ H01L 21/563; H01L 23/49568
USPC ........................ 438/121–127; 257/786–796
See application file for complete search history.

(56) References Cited

U.S. PATENT DOCUMENTS

| | | |
|---|---|---|
| 2012/0027229 A1 | 1/2012 | Bartley et al. |
| 2012/0077312 A1* | 3/2012 | Lee ........................ H01L 21/563 |
| | | 438/108 |
| 2012/0139097 A1 | 6/2012 | Lee et al. |
| 2013/0099368 A1 | 4/2013 | Han |
| 2013/0207257 A1 | 8/2013 | Sugaya |
| 2016/0013114 A1 | 1/2016 | Vadhavkar et al. |
| 2016/0064355 A1* | 3/2016 | Pan ...................... H01L 25/0657 |
| | | 257/704 |

OTHER PUBLICATIONS

International Search Report and Written Opinion dated Jan. 12, 2018 in International Application No. PCT/US2017/053517, 14 pages.

* cited by examiner

*Primary Examiner* — Calvin Lee
(74) *Attorney, Agent, or Firm* — Perkins Coie LLP

(57) ABSTRACT

Semiconductor die assemblies having high efficiency thermal paths and molded underfill material. In one embodiment, a semiconductor die assembly comprises a first die and a plurality of second dies. The first die has a first functionality, a lateral region, and a stacking site. The second dies have a different functionality than the first die, and the second dies are in a die stack including a bottom second die mounted to the stacking site of the first die and a top second die defining a top surface of the die stack. A thermal transfer structure is attached to at least the lateral region of the first die and has a cavity in which the second dies are positioned. An underfill material is in the cavity between the second dies and the thermal transfer structure, and the underfill material covers the top surface of the die stack.

17 Claims, 14 Drawing Sheets

STACKED SEMICONDUCTOR DIE ASSEMBLIES WITH HIGH EFFICIENCY THERMAL PATHS AND MOLDED UNDERFILL

TECHNICAL FIELD

The disclosed embodiments relate to semiconductor die assemblies. In particular, the present technology relates to stacked semiconductor die assemblies with highly efficient thermal paths and a molded underfill material, and associated systems and methods.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to connect the die to higher level circuitry.

Semiconductor manufacturers strive to reduce the size of die packages to fit within the space constraints of electronic devices while increasing the functional capacity of each package to meet operating parameters. One approach for increasing the processing power and/or storage capacity of a semiconductor package without substantially increasing the surface area covered by the package (i.e., the "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs). A Hybrid Memory Cube (HMC) is one particularly useful device that includes a plurality of memory dies stacked on the top of a logic die.

DETAILED DESCRIPTION

Figure 1:
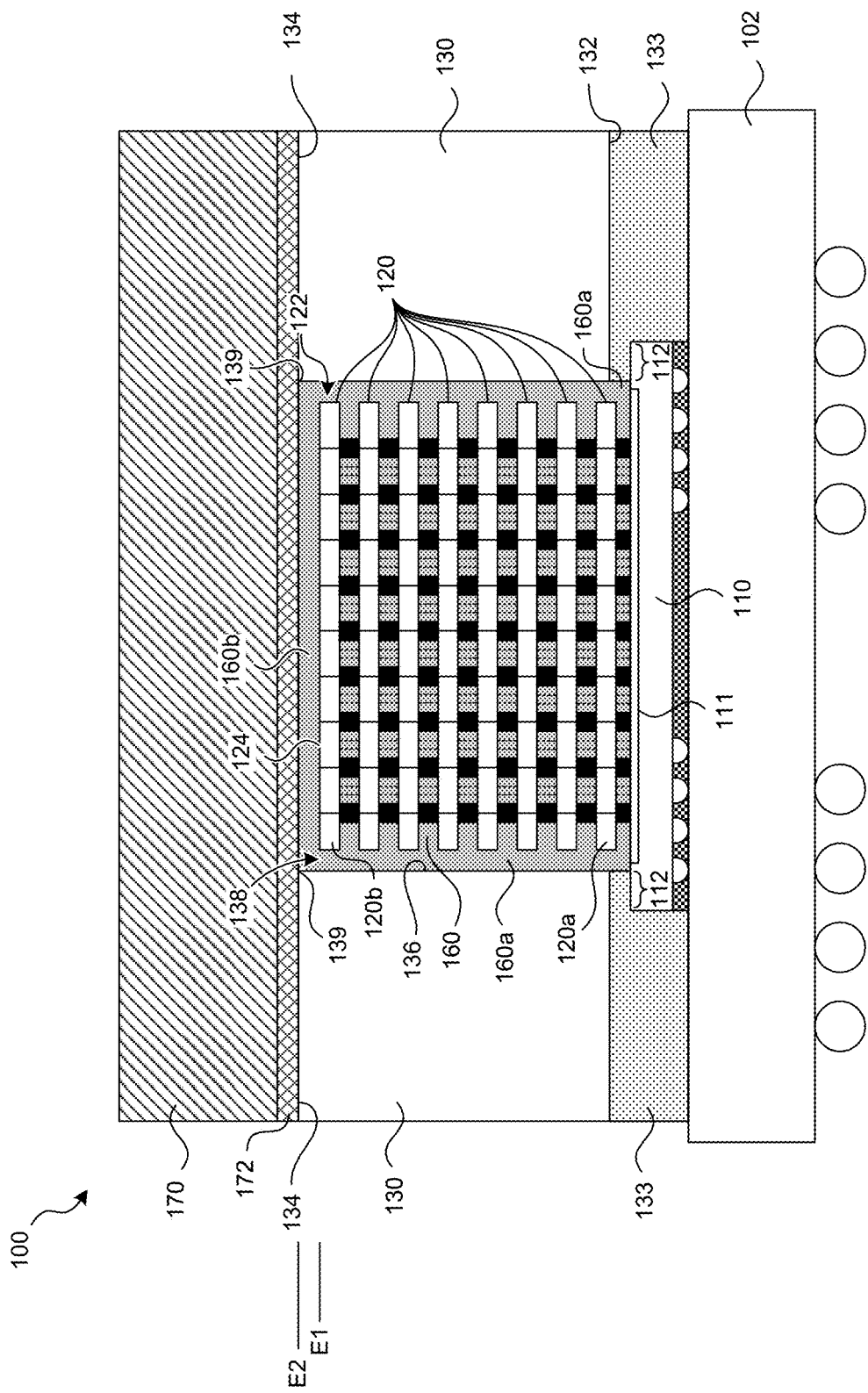
FIG. 1 is a cross-sectional view illustrating a semiconductor die assembly in accordance with embodiments of the present technology.

Specific details of several embodiments of stacked semiconductor die assemblies with highly efficient thermal paths and molded underfill material are described below along with the associated systems and methods. The term "semiconductor die" generally refers to a die having integrated circuits or components, data storage elements, processing components, and/or other features manufactured on semiconductor substrates. For example, semiconductor dies can include integrated memory circuitry and/or logic circuitry. Semiconductor dies and/or other features in semiconductor die packages can be said to be in "thermal contact" with one another if the two structures can exchange energy through heat via, for example, conduction, convection and/or radiation. A person skilled in the relevant art will also understand that the technology may have additional embodiments, and that the technology may be practiced without several of the details of the embodiments described below with reference to FIGS. 1-5.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Stacked die arrangements, such as an HMC having a stack of a plurality of memory dies attached to the top of a logic die, have several manufacturing challenges. For example, in vertically-stacked die packages the heat from the individual dies is additive and the aggregated heat is difficult to dissipate. This increases the operating temperatures of the individual dies, the junctions between the dies, and the package as a whole, which can cause the stacked dies to reach temperatures above their maximum operating temperatures (Tmax). The problem is also exacerbated as the density of the dies in the package increases. Moreover, when there are different types of dies in the die stack, the T(max) of the whole device is limited to the T(max) of the die with the lowest T(max).

Another challenge of stacked die assemblies is that packaging capable of dissipating sufficient heat from the dies is expensive to manufacture. Many existing designs initially flow a liquid dispense underfill material between the dies and then cover the die stack with a thermally conductive "lid" that completely encloses the top and sides of the memory die stack. This process, however, constitutes a considerable portion of the overall cost of the finished device.

To address these challenges, one embodiment of the present technology is a semiconductor die assembly comprising a package support substrate, a first semiconductor die mounted to the package support substrate, and a die stack including a plurality of second semiconductor dies stacked on each other. The first semiconductor die has a stacking site and a lateral region extending laterally from the stacking site. The die stack has a bottom second semiconductor die mounted to the stacking site of the first semiconductor die, a top second semiconductor die having a top surface defining a top surface area of the die stack, and sides. The semiconductor die assembly further includes a thermal transfer structure attached to the lateral region of the first semiconductor die, and the thermal transfer structure surrounds the die stack. The thermal transfer structure has a cavity in which the second semiconductor dies are positioned and an opening larger than the top surface area of the die stack. The semiconductor die assembly further comprises a molded underfill material in the cavity between the second semiconductor dies and the thermal transfer structure. The underfill material covers the sides of the die stack.

Another embodiment of the present technology is a semiconductor die assembly comprising a package support substrate, a first semiconductor die mounted to the package support substrate, and a die stack having a plurality of second semiconductor dies. The first semiconductor die has a lateral region and a stacking area inward of the lateral region, and the die stack includes a bottom second semiconductor die mounted to the stacking area of the first die and a top second semiconductor die having a top surface. The semiconductor die assembly of this embodiment also includes a thermally conductive frame around the die stack, and an injected underfill material between the thermally conductive frame and the die stack. The thermally conductive frame has a bottom surface mounted to the lateral region of the first semiconductor die and an upper surface at an elevation that is at or above the top surface of the top second die. The injected underfill material has a height at least coplanar with the upper surface of the thermally conductive frame. In some embodiments, the injected underfill material can cover the top surface of the top second semiconductor die.

FIG. 1 is a cross-sectional view illustrating a semiconductor die assembly 100 ("assembly 100") in accordance with an embodiment of the present technology. The assembly 100 includes a package support substrate 102, a first semiconductor die 110 mounted to the package support substrate 102, and a plurality of second semiconductor dies 120 arranged in a stack 122 at a stacking area 111 of the first die 110, such as a central region or an off-center region. The first die 110 further includes at least one lateral region 112 laterally outboard of the second dies 120 on at least one side of the first die 110. In the embodiment shown in FIG. 1, the first die 110 has two lateral regions 112 outboard of opposing sides of the die stack 122. The die stack 122 can include a bottom second die 120a mounted to the first die 110 and a top second die 120b having a top surface 124. The top surface 124 defines a top surface area of the die stack 122 at an elevation E1.

The assembly 100 can further include a thermal transfer structure (TTS) 130 around the die stack 122. In the embodiment illustrated in FIG. 1, the TTS 130 is a frame having a bottom surface 132 adhered to the lateral portions 112 of the first die 110 and the support substrate 102 by an adhesive 133, an upper surface 134 at an elevation E2, and an inner sidewall 136. The elevation E2 of the upper surface 134 is above the elevation E1 of the top surface 124 of the top second die 120b in the illustrated example. In other embodiments, the upper surface 134 can be at least substantially coplanar with the top surface 124. The inner sidewall 136 defines a cavity 138 in which the second dies 120 are positioned and an opening defined by the upper edge 139 where the sidewall 136 meets the upper surface 134. The opening shown in FIG. 1 is larger than the top surface area of the top surface 124. The TTS 130 is made from a material with high thermal conductivity, such as copper, aluminum, silicon, or other suitable thermally conductive materials. In several embodiments the TTS 130 also has a coefficient of thermal expansion (CTE) similar to the CTE of the substrate material of the first die 110 to reduce stress on the dies 110/120 caused during temperature cycling in normal use while still having a high thermal conductivity to effectively transfer heat from the first die 110. This is expected the mitigate cracks in the dies 110/120 or delamination of the TTS 130. Suitable CTE-matching materials for the TTS 130 include, but are not limited to, molybdenum (Mo), alloys of copper-tungsten (Cu—W), alloys of copper-molybdenum (Cu—Mo), silicon carbide (SiC) and/or aluminum nitride (AlN). In some instances, these materials may also be lighter than copper and result in significantly lighter packages. When the TTS 130 is made from a metal, it can be stamped or laser cut into a suitable shape to form the opening and surround the second dies 120 of the die stack 122. The adhesive 133 can be a thermal interface material ("TIM") or another suitable adhesive. For example, TIMs and other adhesives can include silicone-based greases, gels, or adhesives that are doped with conductive materials (e.g., carbon nano-tubes, solder materials, diamond-like carbon (DLC), etc.), as well as phase-change materials.

The assembly 100 further includes an underfill material 160 (individual portions identified respectively by reference numbers 160a and 160b) between each of the second dies 120 and between the first die 110 and the bottom second die 120a. The embodiment of the underfill material 160 shown in FIG. 1 has a side underfill portion 160a extending or otherwise covering the sides of the die stack 122, and a top underfill portion 160b over the top surface 124 of the top second die 120b. The top underfill portion 160b can directly contact the top surface 124 of the top second die 120b.

The assembly 100 can optionally include a thermally conductive lid 170 adhered to the upper surface 134 of the TTS 130 and the top underfill portion 160b by an adhesive 172. The conductive lid 170 can be a plate made from a material having a high thermal conductivity, such as copper, aluminum, silicon, or other suitable materials.

The assembly 100 is expected to provide enhanced thermal dissipation of heat from the first die 110 and the stack 122 of second dies 120. For example, since the TTS 130 is made from a material with a high thermal conductivity and directly mounted on the lateral regions 112 of the first die 110 via a TIM, it efficiently transfers heat along a path directly from the lateral region 112 of the first die 110 to the thermal lid 170. The TTS 130 is also simple and easy to install, so it provides a simple, cost-effective way to efficiently dissipate heat from the high temperature lateral portions 112 of the first die 110. Moreover, it is also easy to injection mold the underfill material 160 into the cavity 138 because the large opening in the TTS 130 enables a simple injection mold platen to be placed directly on the TTS 130.

Several embodiments of the assembly 100 shown in FIG. 1 can accordingly reduce the operating temperatures of the individual dies 110, 120 in the assembly 100 such that they stay below their designated maximum temperatures (Tmax). This can be very useful when the assembly 100 is arranged as an HMC because the first die 110 is generally a larger logic die and the second dies 120 are generally memory dies, and logic dies typically operate at a much higher power level than memory dies (e.g., 5.24 W compared to 0.628 W). The logic die HMC configuration generally concentrates a significant amount of heat at the lateral regions 112 of the first die 110. The logic die may also have a higher power density at the lateral regions 112, which further concentrates heat and thereby produces higher temperatures in the lateral regions 112. As such, by directly coupling a large percentage of the lateral regions 112 of the first die 110 to the highly conductive TTS 130 via the adhesive 133, the heat can be efficiently removed from the lateral regions 112 of the first die.

Figure 2A:
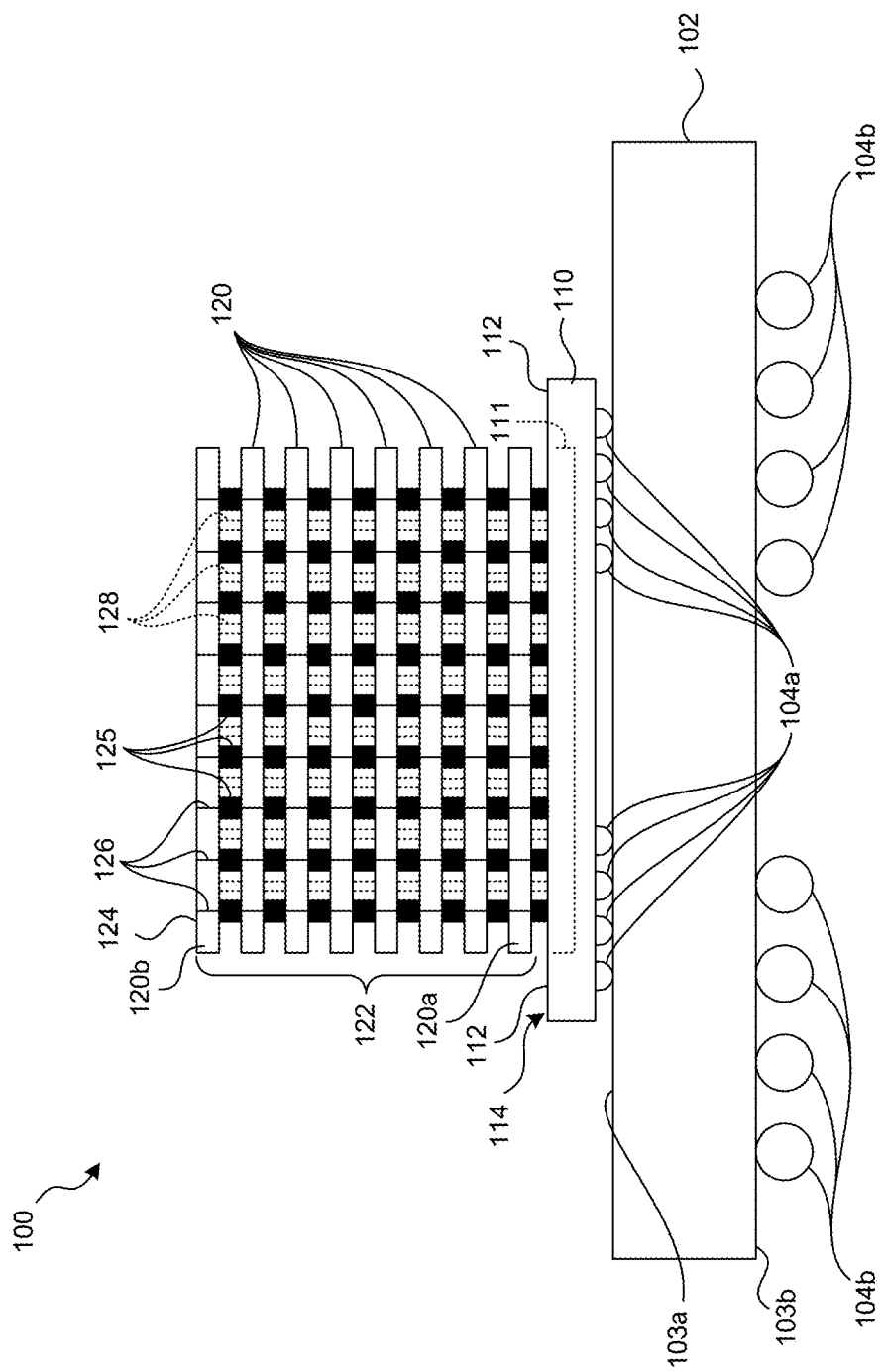
FIG. 2A is a cross-sectional view and FIG. 2B is a top plan view illustrating an aspect of a method of manufacturing a semiconductor die assembly in accordance with embodiments of the technology.
Figure 2B:
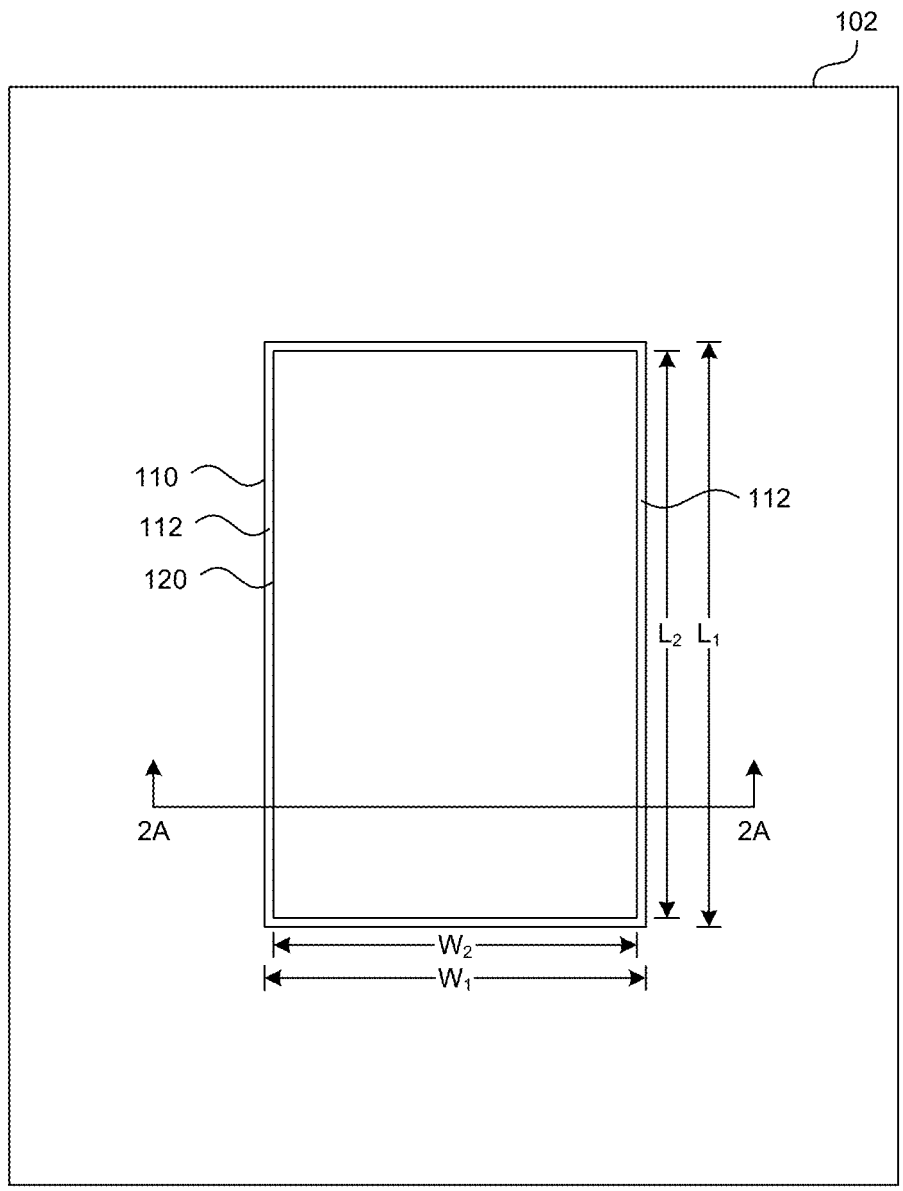

FIGS. 2A-2J illustrate sequential aspects of a method of manufacturing the assembly 100 in accordance with embodiments of the present technology. FIG. 2A is a cross-sectional view and FIG. 2B is a top plan view of the assembly 100 before the TTS and underfill material have been installed. Referring to FIG. 2A, the package support substrate 102 is configured to connect the first and second dies 110, 120 to external electrical components of higher-level packaging (not shown). For example, the package support substrate 102 can be an interposer or printed circuit board that includes semiconductor components (e.g., doped silicon wafers or gallium arsenide wafers), non-conductive components (e.g., various ceramic substrates, such as aluminum oxide (Al2O3), aluminum nitride (AlN), etc.), and/or conductive portions (e.g., interconnecting circuitry, TSVs, etc.). In the embodiment illustrated in FIG. 2A, the package support substrate 102 is electrically coupled to the first die 110 at a first side 103a of the package support substrate 102 via a plurality of first electrical connectors 104b and to external circuitry (not shown) at a second side 103b of the package support substrate 102 via a plurality of second electrical connectors 104b (collectively referred to as "the electrical connectors 104"). The electrical connectors 104 can be solder balls, conductive bumps and pillars, conductive epoxies, and/or other suitable electrically conductive elements. In various embodiments, the package support substrate 102 can be made from a material with a relatively high thermal conductivity to enhance heat dissipation at the back side of the first semiconductor die 110.

As shown in FIGS. 2A and 2B, the first die 110 can have a larger footprint than the stacked second dies 120. The first and second dies 110, 120 can be rectangular, circular, and/or other suitable shapes and may have various different dimensions. Referring to FIG. 2B, for example, the first die 110 can have a length L1 and a width W1, and the individual second dies 120 can each have a length L2 and a width W2. Each lateral region 112 (known to those skilled in the art as a "porch" or "shelf") of the first die 110 can be defined by the relative dimensions of the first and second dies 110 and 120 and the position of the die stack 122 on a forward-facing surface 114 (FIG. 2A) of the first die 110. In the embodiment illustrated in FIGS. 2A and 2B, the die stack 122 is centered with respect to the length W1 of the first die 110 such that lateral regions 112 extend laterally beyond two opposite sides of the stack 122 by equal distances. In embodiments where both the width and length of the first die 110 are greater than those of the centered die stack 122, a continuous lateral region 112 may extend around the entire perimeter of the second dies 120. In other embodiments, the stack 122 may be offset with respect to the forward-facing surface 114 (FIG. 2A) of the first die 110 such that only one lateral region 112 extends outboard from only one side of the stack 122. In further embodiments, the first and second dies 110 and 120 can be circular, and therefore the relative diameters of the first and second dies 110 and 120 define the lateral region 112.

The first and second dies 110, 120 can include various types of semiconductor components and functional features, such as dynamic random-access memory (DRAM), static random-access memory (SRAM), flash memory, other forms of integrated circuit memory, processing circuits, imaging components, and/or other semiconductor features. In various embodiments, for example, the assembly 100 is configured as an HMC in which the stacked second dies 120 are memory dies that provide data storage and the first die 110 is a high-speed logic die that provides memory control (e.g., DRAM control) within the HMC. In other embodiments, the first and second dies 110 and 120 may include other semiconductor components, and/or the semiconductor components of the individual second dies 120 in the stack 122 may differ.

As shown in FIG. 2A, the second dies 120 can be electrically coupled to one another in the stack 122 and to the underlying first die 110 by a plurality of electrically conductive elements 125 positioned between adjacent dies 110, 120. Although the stack 122 shown in FIG. 2A includes eight second dies 120 electrically coupled together, in other embodiments the stack 122 can include more or less than eight dies (e.g., 2-4 dies, or at least 9 dies etc.). The electrically conductive elements 125 can have various suitable structures, such as pillars, columns, studs, bumps, and can be made from copper, nickel, solder (e.g., SnAg-based solder), conductor-filled epoxy, and/or other electrically conductive materials. In selected embodiments, for example, the electrically conductive elements 125 can be copper pillars, whereas in other embodiments the electrically conductive elements 125 can include more complex structures, such as bump-on-nitride structures.

As further shown in FIG. 2A, the individual second dies 120 can each include a plurality of TSVs 126 aligned on one or both sides with corresponding electrically conductive elements 125 to provide electrical connections at opposing sides of the second dies 120. Each TSV 126 can include an electrically conductive material (e.g., copper) that passes completely through the individual second dies 120 and an electrically insulative material surrounding the electrically conductive material to electrically isolate the TSVs 126 from the remainder of the second dies 120. Though not shown in FIG. 2A, the first die 110 can also include a plurality of TSVs to electrically couple the first die 110 to higher level circuitry. Beyond electrical communication, the TSVs 126 and the electrically conductive elements 125 provide thermal conduits through which heat can be transferred away from the first and second dies 110 and 120. In some embodiments, the dimensions of the electrically conductive elements 125 and/or the TSVs 126 can be increased to enhance heat transfer vertically through the stack 122. For example, the individual electrically conductive elements 125 can each have a diameter of about 15-30 μm or other suitable dimensions to enhance the thermal pathway through the dies 110, 120. In other embodiments, the second dies 120 can be electrically coupled to one another and to the first die 110 using other types of electrical connectors (e.g., wirebonds) that may also provide thermal pathways through the stack 122.

In various embodiments, the assembly 100 optionally includes a plurality of thermally conductive elements 128 (shown in broken lines) positioned interstitially between the electrically conductive elements 125. The individual thermally conductive elements 128 can be at least generally similar in structure and composition as that of the electrically conductive elements 125 (e.g., copper pillars). However, the thermally conductive elements 128 are not electrically coupled to the TSVs 126 or other electrically active components of the dies 110 and 120, and therefore the thermally conductive elements 128 do not provide electrical connections between the second dies 120. Instead, the thermally conductive elements 128 are electrically isolated "dumb elements" that increase the overall thermal conductivity through the stack 122 to enhance the heat transfer upward through the die stack 122. For example, in embodiments where the assembly 100 is configured as a HMC, the addition of the thermally conductive elements 128 between the electrically conductive elements 125 has been shown to decrease the operating temperature of the HMC by several degrees (e.g., about 6-7° C.).

Figure 2C:
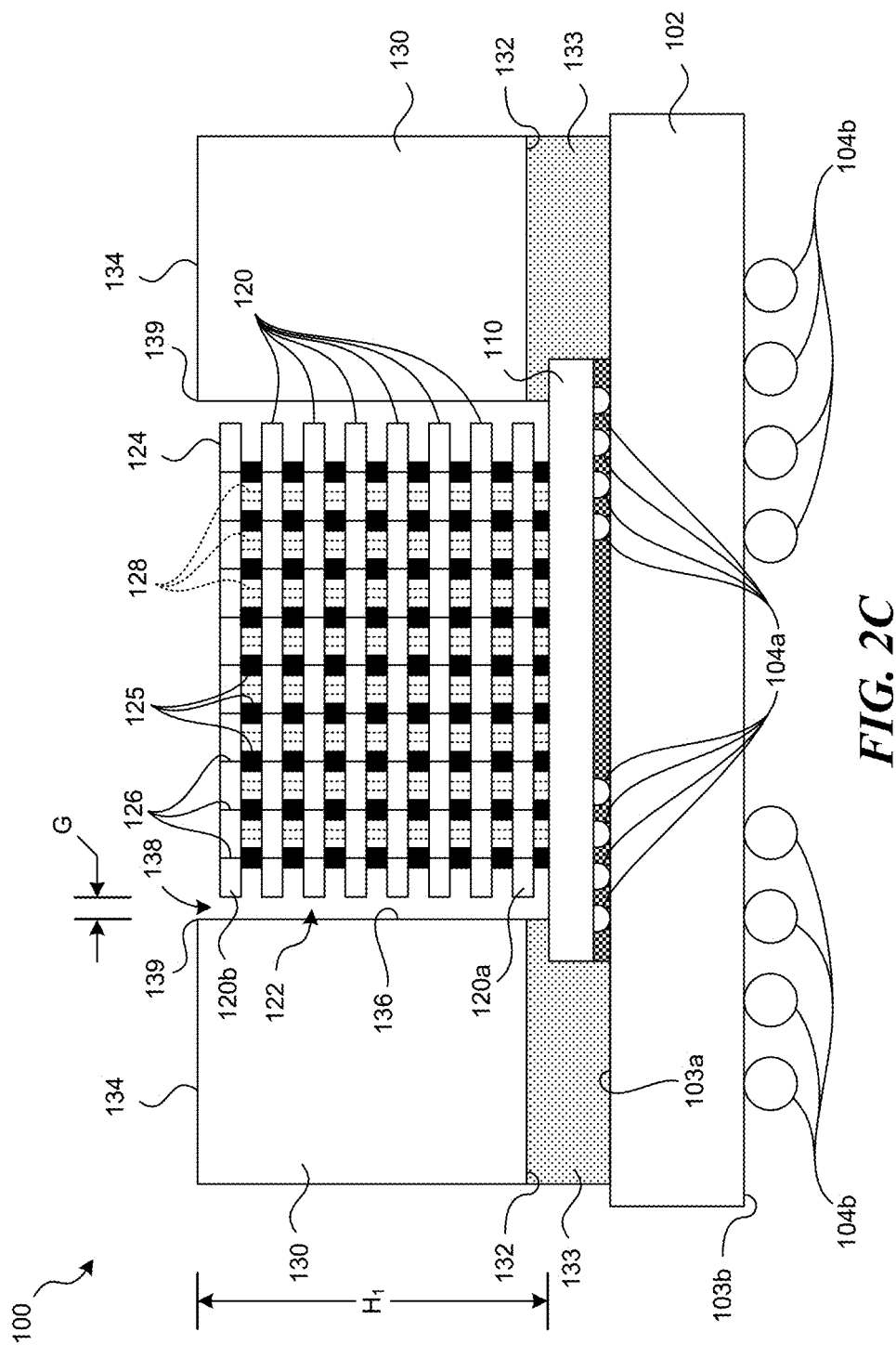
FIG. 2C is a cross-sectional view and FIG. 2D is a top plan view illustrating an aspect of a method of manufacturing a semiconductor die assembly in accordance with embodiments of the technology.
Figure 2D:
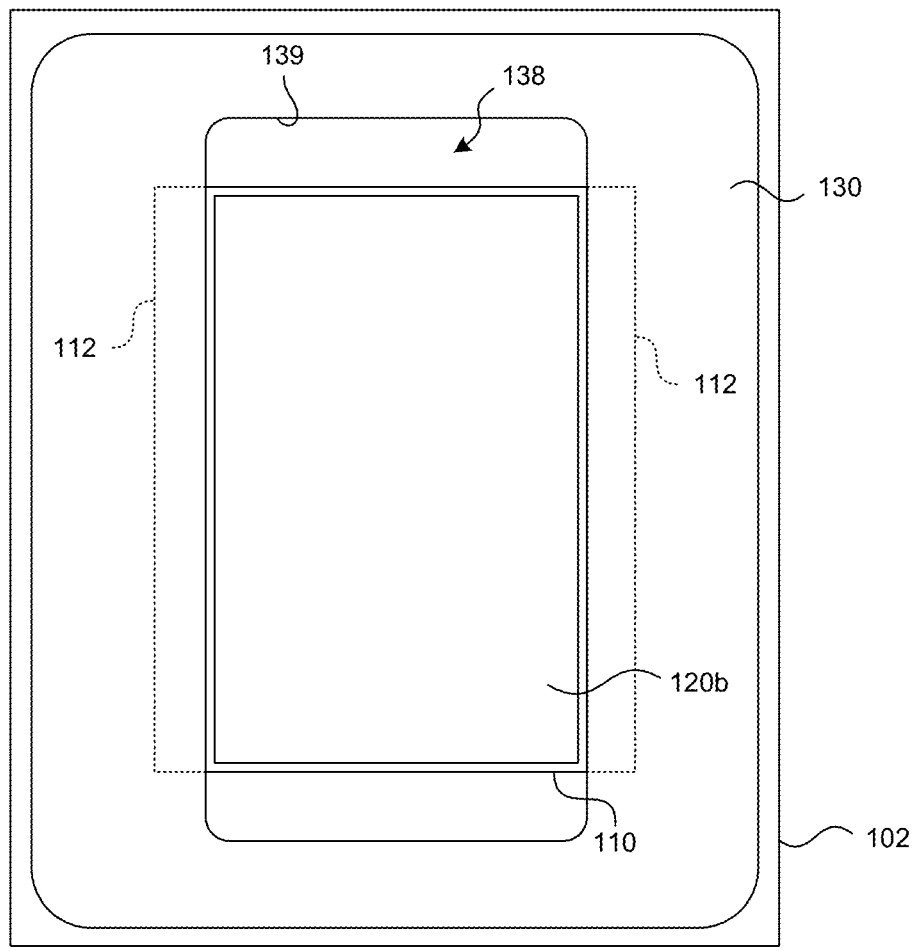

FIG. 2C is a cross-sectional view and FIG. 2D is a top plan view illustrating the assembly 100 after the TTS 130 has been attached to the first die 110 and the package support substrate 102. Referring to FIG. 2C, an inner portion of the TTS 130 is configured to be positioned over the lateral regions 112 of the first die 110. The sidewall 136 of the TTS 130 extends to a height (H1) relative to the stack 122 of second dies 120 that is at or above the elevation of the top surface 124 of the top second die 120*b*. The sidewall 136 is also spaced apart from the stack 122 of second dies 120 by a gap (G) such that the TTS 130 covers a significant percentage of the lateral region 112 and the opening defined by the edge 139 is larger than the surface area of the top surface 124 of the top second die 120*b*. The adhesive 133 can be a TIM. In the embodiment shown in FIG. 2D, the TTS 130 is a frame or a ring that completely surrounds the second dies 120 and exposes the top surface 124 of the top second die 120*b*.

Figure 2E:
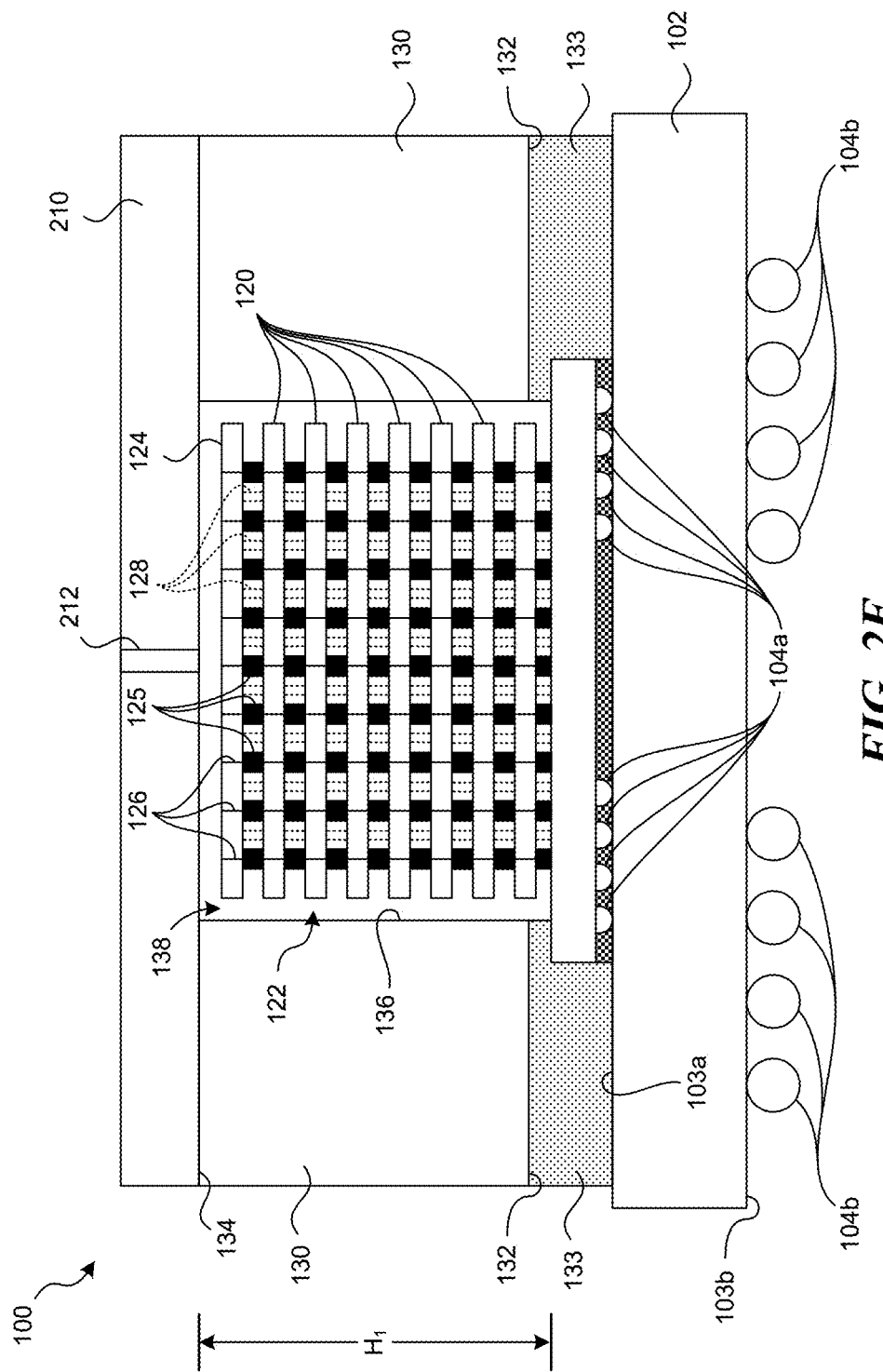
FIG. 2E is a cross-sectional view and FIG. 2F is a top plan view illustrating an aspect of a method of manufacturing a semiconductor die assembly in accordance with embodiments of the technology.
Figure 2F:
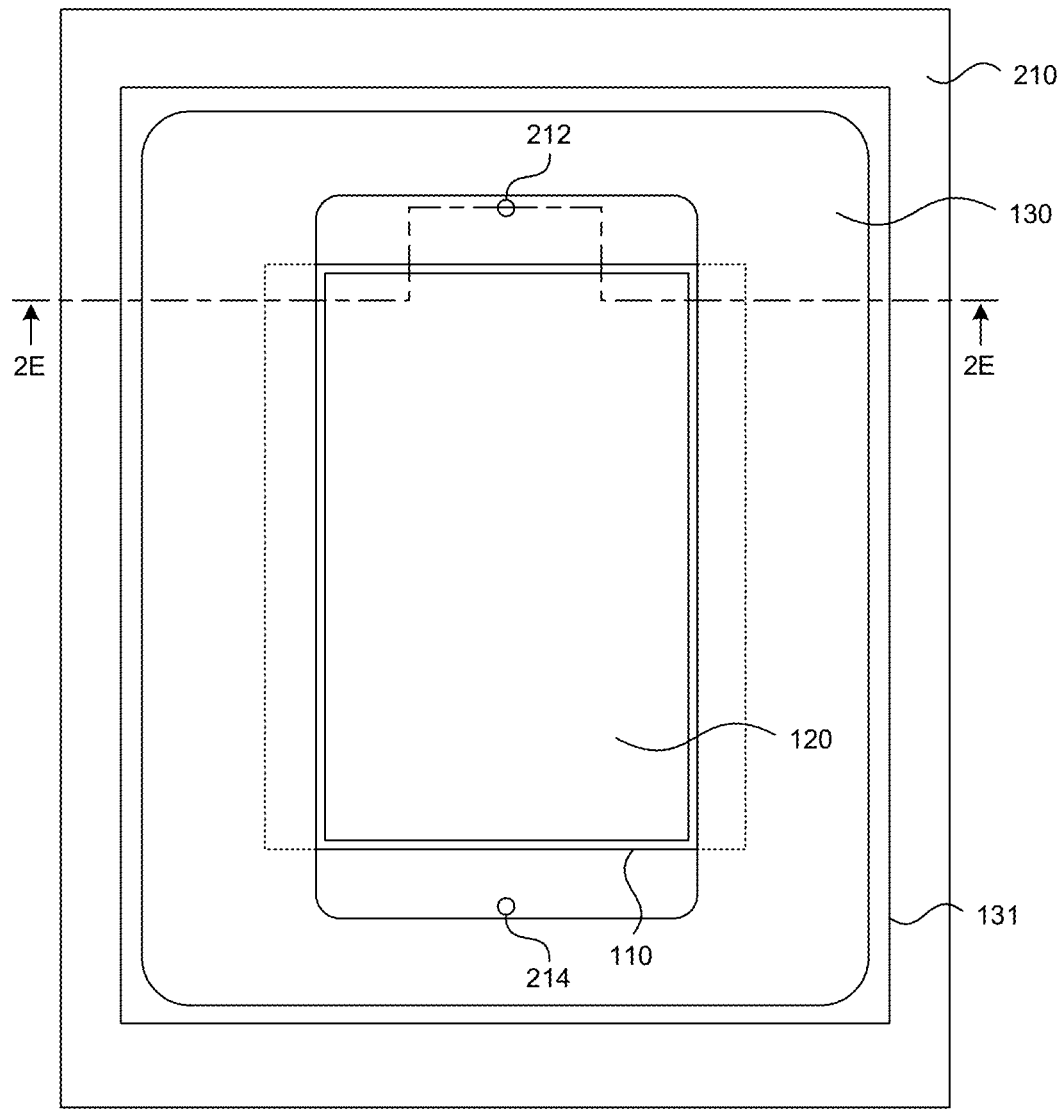

FIG. 2E is a cross-sectional view illustrating another stage of the method of manufacturing the assembly 100 after a mold platen 210 is placed against the upper surface 134 of the TTS 130, and FIG. 2F is a top view of the mold platen 210 over the first die 110, the die stack 120, and the TTS 130. The mold platen has an inlet 212 through which an underfill material can be injected under pressure into the cavity 138 (FIG. 2E) defined by the TTS 130. The mold platen 210 can also include a vent 214 (FIG. 2F) at an opposing side of the die stack 122 relative to the inlet 212.

Figure 2G:
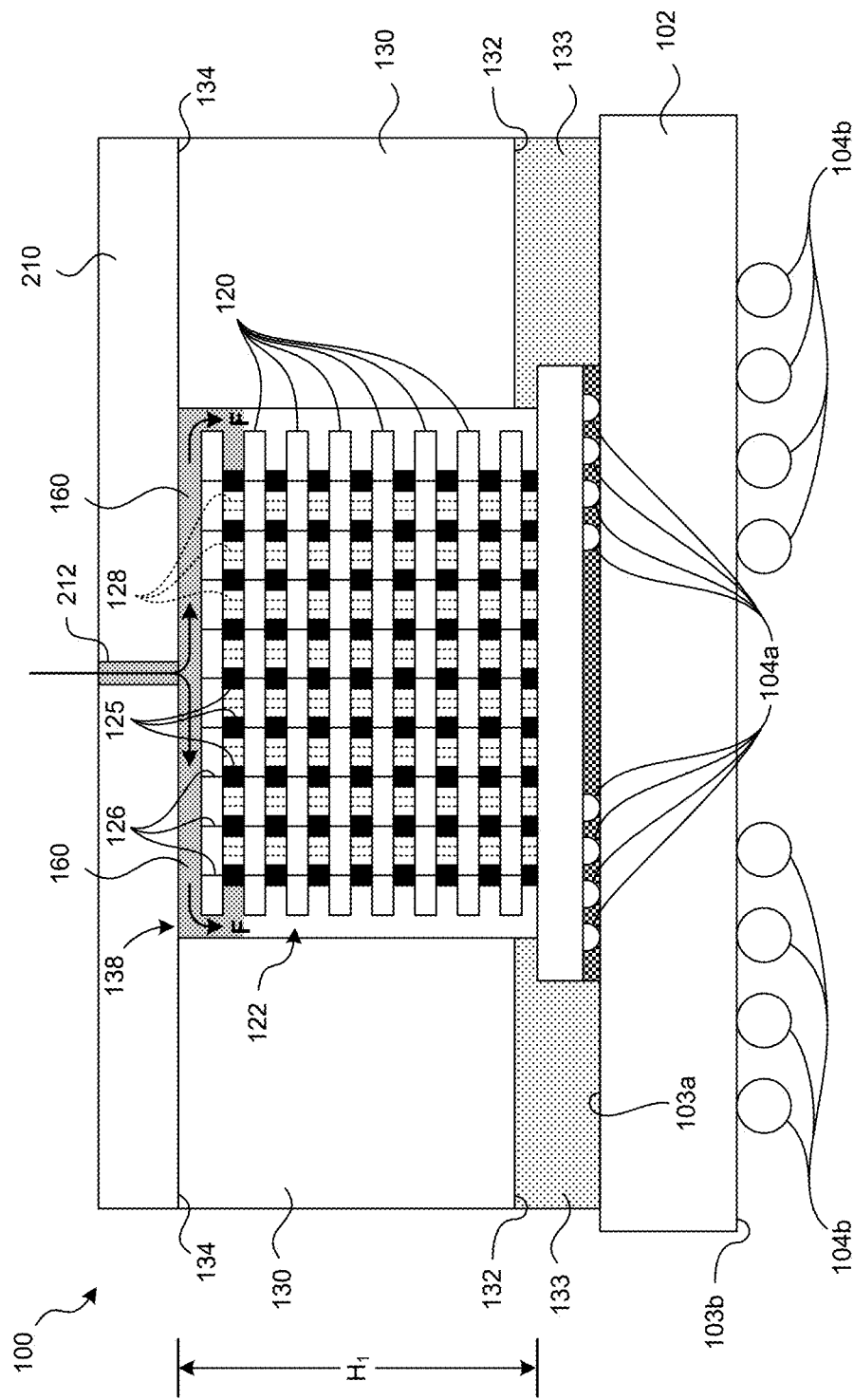
FIG. 2G is a cross-sectional view and FIG. 2H is a top plan view illustrating an aspect of a method of manufacturing a semiconductor die assembly in accordance with embodiments of the technology.

FIG. 2G is a cross-sectional view illustrating the assembly 100 as the underfill material 160 is injected through the inlet 212 and into the cavity 138. The underfill material 160 flows over the top surface 124 of the top second die 120*b* and along the sides of the die stack 122 until the underfill material 160 is between: (a) each of the second dies 120; (b) the first die 110 and the bottom second die 120*a*; and (c) the sides of the die stack 122 and the inner sidewall 136 of the TTS 130. The underfill material 160 is typically an injectable molded underfill material.

Figure 2H:
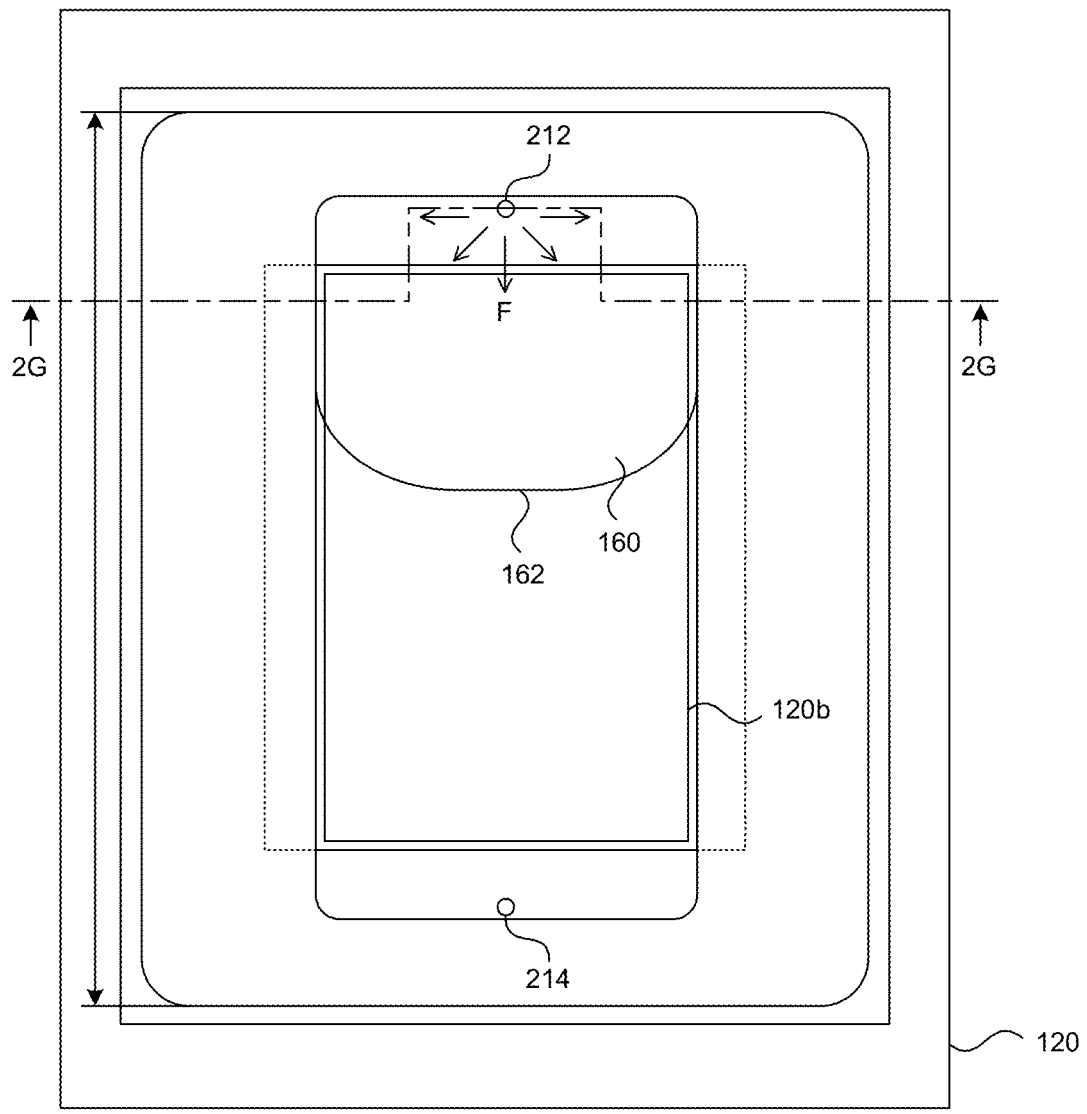

FIG. 2H is a top plan view illustrating the method at the stage of FIG. 2G. As shown in FIG. 2H, the molded underfill material 160 flows across the top surface of the top second die 120*b* (arrow F) because the mold platen 210 is spaced apart from the top surface of the top second die 120*b*. The molded underfill material 160 accordingly has a leading edge 162 that propagates along the top surface of the top second die 120*b*. As the molded underfill material 160 fills the cavity 138 (FIG. 2G), air displaced from the cavity 138 flows out of the vent 214.

Figure 2I:
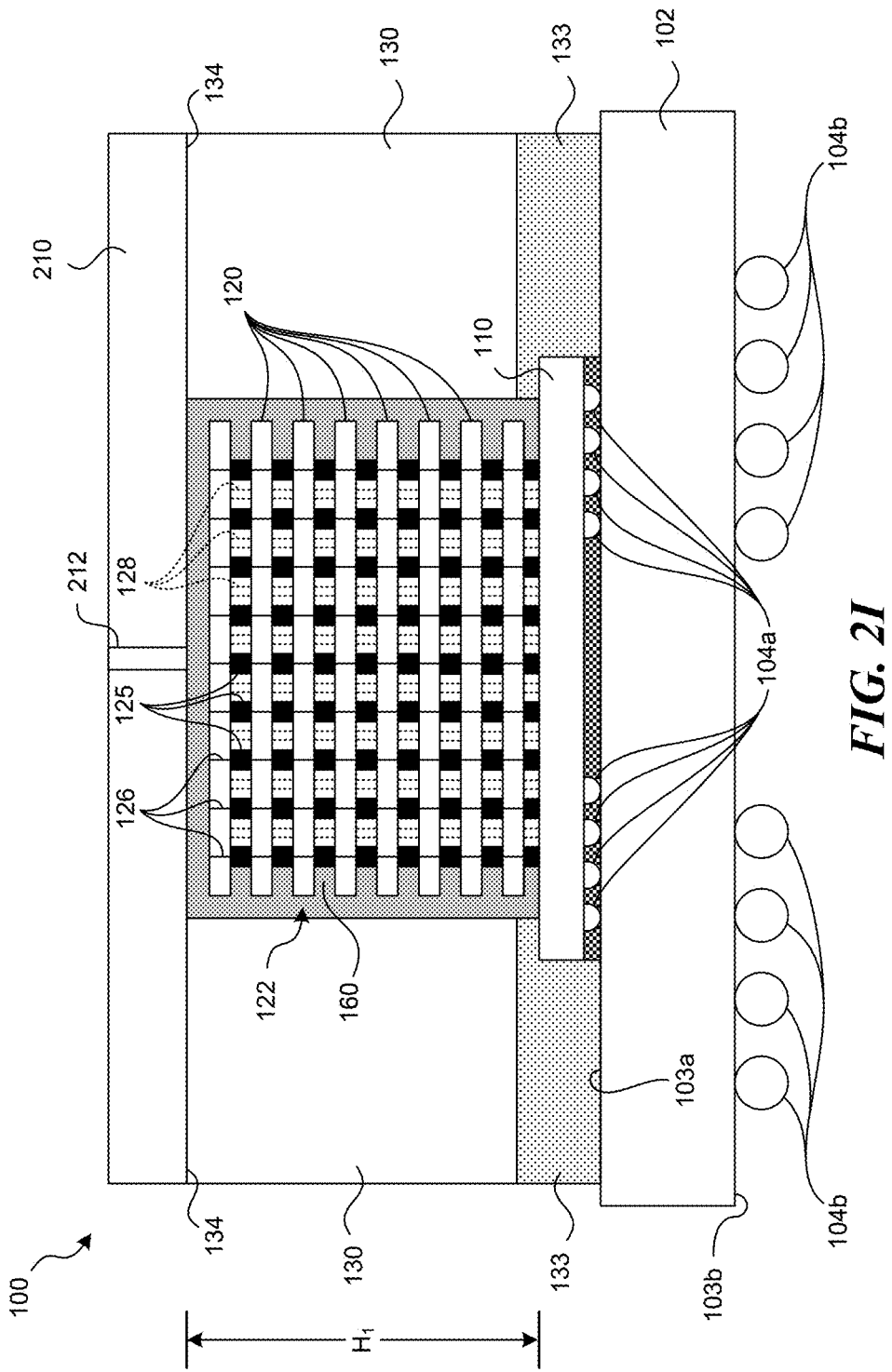
FIG. 2I is a cross-sectional view illustrating an aspect of a method of manufacturing a semiconductor die assembly in accordance with embodiments of the technology.

FIG. 2I is a cross-sectional view illustrating the assembly 100 after the underfill material 160 has been injected into the cavity until it reaches the bottom of the mold platen 210. As a result, the bottom surface of the mold platen 210 can define the top surface of the underfill material in several embodiments. In other embodiments, the bottom surface of the mold platen 210 can be formed to create the desired height of the top surface of the underfill material 160 either at, below or above the elevation of the upper surface 134 of the TTS 130.

Figure 2J:
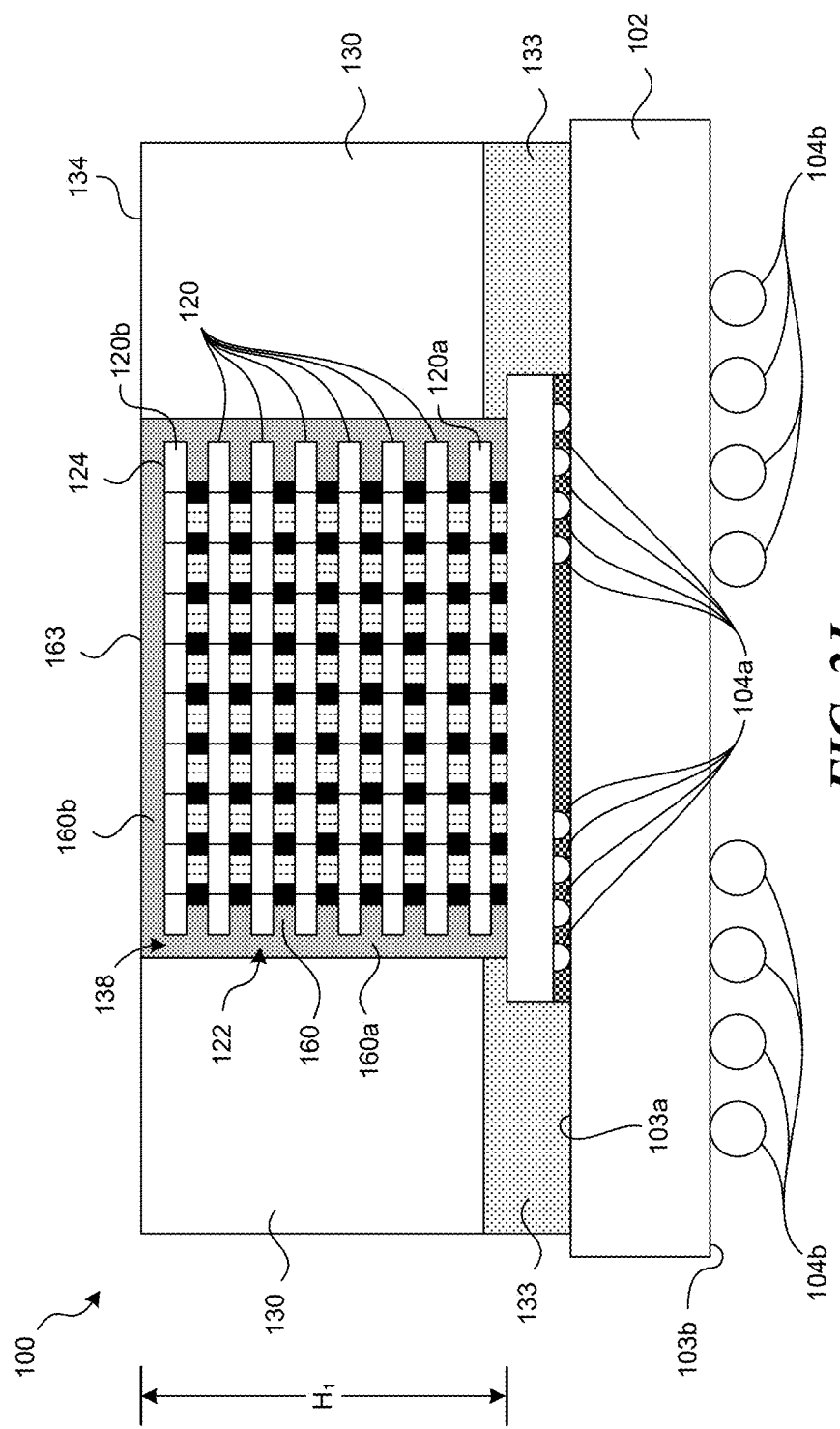
FIG. 2J is a cross-sectional view illustrating an aspect of a method of manufacturing a semiconductor die assembly in accordance with the present technology.

FIG. 2J is a cross-sectional view illustrating the assembly 100 after the mold platen 210 has been removed. The top underfill portion 160*b* accordingly covers the top surface 124 of the top second die 120*b*, and the top surface of the top underfill portion 160*b* is at least substantially coplanar with the upper surface 134 of the TTS 130. The side underfill portion 160*a* completely covers the sides of all the second dies in the die stack 122 and fills the remainder of the cavity 138 including the interstitial spaces between the second dies 120 and the space between the first die 110 and the bottom second die 120*a*. A thermally conductive lid, such as the thermally conductive lid 170 shown in FIG. 1, can optionally be attached to the upper surface 134 of the TTS 130 and the top surface 163 of the top underfill portion 160*b* using an adhesive (e.g., a TIM).

The process of manufacturing the assembly 100 illustrated in FIGS. 2A-2J is expected to economically produce a packaged hybrid semiconductor device with high thermal conductivity to efficiently dissipate heat generated by the first die 110. Instead of conventional lids that completely encase the sides and cover the top of the die stack of second dies, the TTS 130 of the assembly 100 is inexpensive to manufacture, enables easy injection molding of the underfill material 160 directly through the reusable mold platen 210, and is easy to install. This is expected to reduce the cost of manufacturing packaged hybrid semiconductor devices. Additionally, because the TTS 130 is adhered to the lateral region 112 of the first die 110 via a thermally conductive adhesive before the underfill material 160 is injected into the cavity 138, the TTS 130 is able to contact a large percentage of the lateral region 112 of the first die 110. This is expected to further enhance the thermal efficiency of the removal of heat form the first die 110.

Figure 3:
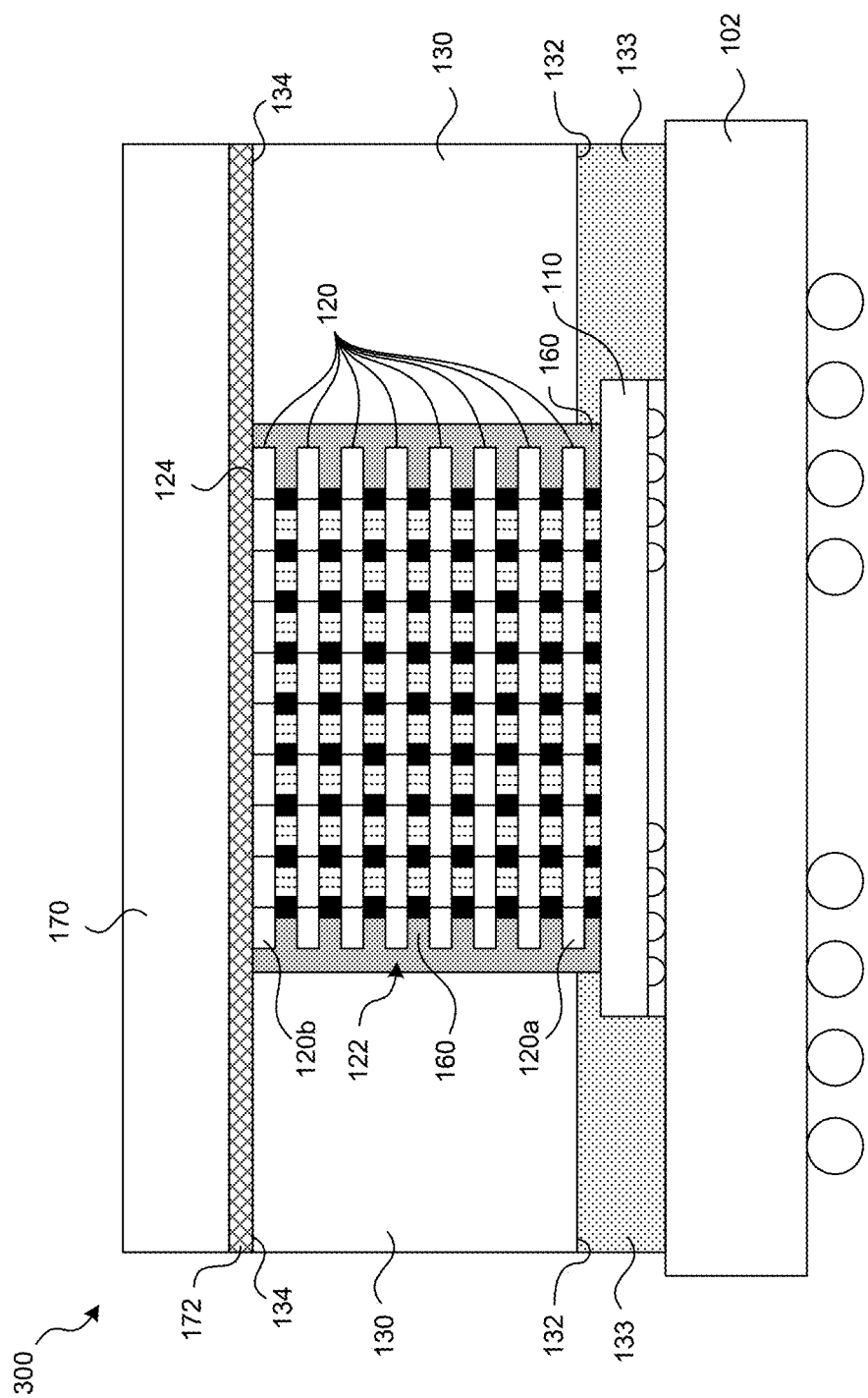
FIG. 3 is a cross-sectional view illustrating a semiconductor die assembly in accordance with an embodiment of the present technology.

FIG. 3 is a cross-section view of a semiconductor die assembly 300 in accordance with another embodiment of the present technology. Like reference numbers refer to like components in FIGS. 1 and 3. The difference between the assembly 100 and the assembly 300 is that the upper surface 134 of the TTS 130 of the assembly 300 is coplanar with the top surface 124 of the top second die 120*b*. As a result, the molded underfill material 160 completely covers the sides of the die stack 122 but not the top surface 124 of the top second die 120*b*. The lack of a mold cap over the top surface 124 of the top second die 120*b* enables the thermally conductive lid 170 to be adhered directly to the top surface 124 of the top second die 120*b* by the adhesive 172. The process of manufacturing the assembly 300 is similar to that described above with respect to the assembly 100 in FIGS. 2A-2J, but the mold platen can rest directly on the upper surface 134 of the TTS 130 and the top surface 124 of the top second die 120*b* during the injection molding process, or a thin removable protective film can be between the mold plate 210 and the TTS 130 and top surface 124 of the top second die 120*b*. The underfill material 160 is accordingly limited to flowing around the sides of the die stack 122. As a result, the assembly 300 enhances the heat transfer from the die stack 122 directly to the central portion of the thermally conductive lid 170.

Figure 4:
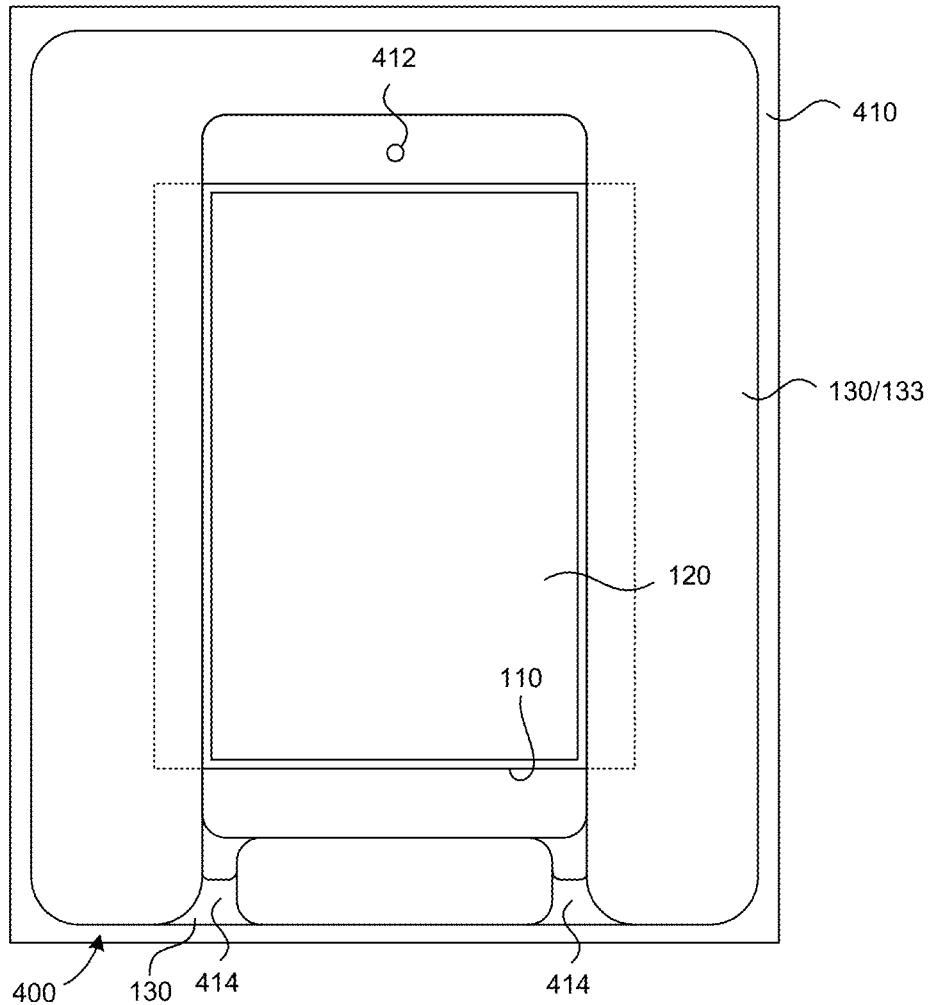
FIG. 4 is a top plan view illustrating a semiconductor die assembly in accordance with an embodiment of the technology.

FIG. 4 is a top plan view of an aspect of manufacturing a semiconductor die assembly 400 that is similar to the semiconductor die assemblies 100 and 300 described above. In this embodiment, a mold platen 410 has an inlet 412 at one and but no vents at the other end. Instead of providing a vent through the mold platen 410, the adhesive 133 that attaches the TTS 130 to the first die 110 has vent channels 414 at one end of the device. The underfill material can accordingly flow through the cavity defined by the TTS 130 as described above with reference to FIGS. 2G, 2H and 3, but the air is displaced from the cavity through the vent channels 414 in the adhesive 133.

Figure 5:
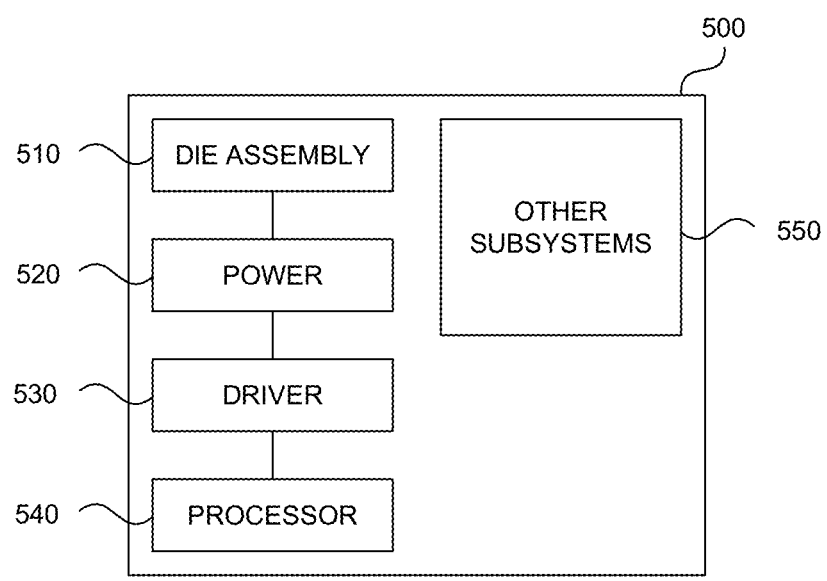
FIG. 5 is a schematic view of a system that includes a semiconductor die assembly configured in accordance with embodiments of the present technology.

Any one of the stacked semiconductor die assemblies described above with reference to FIGS. 1-4 can be incorporated into any of a myriad of larger and/or more complex systems, a representative example of which is system 500 shown schematically in FIG. 5. The system 500 can include a semiconductor die assembly 510, a power source 520, a driver 530, a processor 540, and/or other subsystems or components 550. The semiconductor die assembly 510 can include features generally similar to those of the stacked semiconductor die assemblies described above, and can therefore include multiple thermal paths with good coverage of the lateral region 112 of the first die 110 that enhance heat dissipation. The resulting system 500 can perform any of a wide variety of functions, such as memory storage, data processing, and/or other suitable functions. Accordingly, representative systems 500 can include, without limitation, hand-held devices (e.g., mobile phones, tablets, digital readers, and digital audio players), computers, and appliances. Components of the system 500 may be housed in a single unit or distributed over multiple, interconnected units (e.g., through a communications network). The components of the system 500 can also include remote devices and any of a wide variety of computer readable media.

From the foregoing, it will be appreciated that specific embodiments of the technology have been described herein for purposes of illustration, but that various modifications may be made without deviating from the disclosure. For example, although many of the embodiments of the semiconductor dies assemblies are described with respect to HMCs, in other embodiments the semiconductor die assemblies can be configured as other memory devices or other types of stacked die assemblies. In addition, the semiconductor die assemblies illustrated in FIGS. 1-5 have a plurality of second semiconductor dies arranged in a stack on the first semiconductor die, but other embodiments can have one first semiconductor die stacked on one or more of the second semiconductor dies. Certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor die assembly, comprising:
   a first die having a first functionality, the first die having a lateral region and a stacking site;
   a plurality of second dies having a second functionality different than the first ^functionality, the second dies being arranged in a die stack including a bottom second die mounted to the stacking site of the first die and a top second die defining a top surface of the die stack;
   a thermal transfer structure attached to at least the lateral region of the first die, the thermal transfer structure having a cavity in which the second dies are positioned and an upper surface above the top surface of the die stack, wherein the thermal transfer structure comprises a frame having an opening larger than a perimeter of the top surface of the top second die; and
   an underfill material in the cavity between the second dies and the thermal transfer structure, wherein the underfill material covers the top surface of the die stack.

2. The semiconductor die assembly of claim 1 wherein the frame has an upper surface and the underfill material is coplanar with the upper surface of the frame.

3. The semiconductor die assembly of claim 1 wherein the frame comprises metal.

4. A semiconductor die assembly, comprising:
   a package support substrate;
   a first semiconductor die mounted to the package support substrate, the first die having a lateral region and a stacking area;
   a die stack having a plurality of second semiconductor dies including a bottom second die attached to the stacking area of the first die and a top second die defining a top surface of the die stack;
   a thermally conductive frame around the die stack, wherein the thermally conductive frame has an opening around the top surface of the die stack, a bottom surface attached to the lateral region of the first semiconductor die, an upper surface at an elevation above the top surface of the top second die, and wherein the opening of the thermally conductive frame is larger than the top surface of the top second die; and
   an injected underfill material between the thermally conductive frame and the die stack, wherein the injected underfill material has a height extending to the upper surface of the thermally conductive frame.

5. The semiconductor die assembly of claim 4 wherein the top surface of the top second die has a perimeter and the opening of the frame is spaced laterally apart from the perimeter of the top surface of the top second die by a gap.

6. The semiconductor die assembly of claim 4 wherein the frame comprises a metal, metal alloy or ceramic.

7. The semiconductor die assembly of claim 4 wherein the frame comprises copper.

8. A semiconductor die assembly, comprising:
   a package support substrate;
   a first semiconductor die mounted to the package support substrate, the first die having a stacking site and a lateral region extending laterally from the stacking site;
   a die stack including a plurality of second semiconductor dies stacked on each other, wherein the die stack has a bottom second semiconductor die mounted to the stacking site of the first die, a top second semiconductor die having a top surface defining a top surface area of the die stack, and sides;
   a thermal transfer structure attached to the lateral region of the first die and surrounding the die stack, the thermal transfer structure having a cavity in which the second dies are positioned, and the thermal transfer structure having an upper surface positioned at an elevation above the top surface of the top second semiconductor die, wherein the thermal transfer structure has an opening larger than the top surface area of the die stack; and
   a molded underfill material in the cavity between the second semiconductor dies and the thermal transfer structure, and the underfill material covering the sides of the die stack up to at least the top surface of the die stack.

9. The semiconductor die assembly of claim 8 wherein: the cavity has a sidewall with an upper edge, the thermal transfer structure has an opening larger than the top surface area of the die stack, and the opening is defined by the upper edge of the sidewall.

10. The semiconductor die assembly of claim 8 wherein the underfill material covers the top surface of the top second semiconductor die.

11. The semiconductor die assembly of claim 8 wherein the thermal transfer structure comprises a frame.

12. The semiconductor die assembly of claim 11 wherein the frame is a metal, metal alloy or ceramic.

13. The semiconductor die assembly of claim 12 wherein the frame is copper.

14. The semiconductor die assembly of claim 8 wherein the thermal transfer structure comprises an inner sidewall spaced laterally apart from the sides of the die stack.

15. The semiconductor die assembly of claim 14, wherein the inner sidewall of the thermal transfer structure defines the opening of the thermal transfer structure.

16. The semiconductor die assembly of claim 14 wherein the underfill material covers the top surface of the top second semiconductor die.

17. The semiconductor die assembly of claim 16 wherein the underfill material directly contacts the top surface of the top second semiconductor die and extends to an elevation at least substantially coplanar with the upper surface of the thermal transfer structure.

* * * * *